United States Patent
Berger et al.

(10) Patent No.: US 9,349,804 B2
(45) Date of Patent: May 24, 2016

(54) COMPOSITE WAFER FOR BONDING AND ENCAPSULATING AN SIC-BASED FUNCTIONAL LAYER

(71) Applicant: Infineon Technologies AG, Neubiberg (DE)

(72) Inventors: Rudolf Berger, Regensburg (DE); Hans-Joachim Schulze, Taufkirchen (DE); Anton Mauder, Kolbermoor (DE); Wolfgang Lehnert, Lintach (DE); Günther Ruhl, Regensburg (DE); Roland Rupp, Lauf (DE)

(73) Assignee: Infineon Technologies AG, Neubiberg (DE)

( * ) Notice: Subject to any disclaimer, the term of this patent is extended or adjusted under 35 U.S.C. 154(b) by 115 days.

(21) Appl. No.: 13/765,102

(22) Filed: Feb. 12, 2013

(65) Prior Publication Data

US 2014/0225125 A1     Aug. 14, 2014

(51) Int. Cl.
| | |
|---|---|
| *H01L 21/30* | (2006.01) |
| *H01L 21/46* | (2006.01) |
| *H01L 29/16* | (2006.01) |
| *H01L 21/56* | (2006.01) |
| *H01L 23/29* | (2006.01) |
| *H01L 21/20* | (2006.01) |
| *H01L 29/10* | (2006.01) |
| *H01L 21/02* | (2006.01) |

(52) U.S. Cl.
CPC ...... *H01L 29/1608* (2013.01); *H01L 21/02002* (2013.01); *H01L 21/2007* (2013.01); *H01L 21/56* (2013.01); *H01L 23/291* (2013.01); *H01L 23/298* (2013.01); *H01L 29/1075* (2013.01); *H01L 2924/0002* (2013.01)

(58) Field of Classification Search
CPC ............. H01L 21/02002; H01L 21/2007; H01L 21/56; H01L 29/1075; H01L 29/1608
USPC .................................. 438/455, E21.122
See application file for complete search history.

(56) References Cited

U.S. PATENT DOCUMENTS

| 4,762,269 | A | * | 8/1988 | Gyarmati et al. | 228/194 |
|---|---|---|---|---|---|
| 7,390,735 | B2 | * | 6/2008 | Mehrotra | 438/615 |
| 7,736,554 | B2 | * | 6/2010 | Thebault et al. | 264/29.1 |
| 2011/0052871 | A1 | | 3/2011 | Matsumoto et al. | |

FOREIGN PATENT DOCUMENTS

| CN | 101194373 A | 6/2008 |
|---|---|---|
| DE | 102011054035 A1 | 4/2012 |

* cited by examiner

*Primary Examiner* — Jesse Y Miyoshi
(74) *Attorney, Agent, or Firm* — Murphy, Bilak & Homiller, PLLC

(57) ABSTRACT

A composite wafer includes a substrate and a SiC-based functional layer. The substrate includes a porous carbon substrate core and an encapsulating layer encapsulating the substrate core. The SiC-based functional layer comprises, at an interface region with the encapsulating layer, at least one of: a carbide and a silicide formed by reaction of a portion of the SiC-based functional layer with a carbide-and-silicide-forming metal. An amount of the carbide-and-silicide-forming metal, integrated over the thickness of the functional layer, is $10^{-4}$ mg/cm$^2$ to 0.1 mg/cm$^2$.

10 Claims, 3 Drawing Sheets

FIG. 6a  FIG. 6b

COMPOSITE WAFER FOR BONDING AND ENCAPSULATING AN SIC-BASED FUNCTIONAL LAYER

FIELD OF THE INVENTION

Embodiments described herein relate to wafers, in particular composite wafers having a substrate and a SiC-based functional layer arranged on the substrate and to methods for manufacturing such wafers.

BACKGROUND

SiC based semiconductor devices offer a number of advantages with respect to the more common devices made from silicon wafers. For example, SiC, which withstands high temperatures and has a wide bandgap, is well-suited for applications in high temperature electronics, such as power electronic devices or high-temperature sensors.

Due to the high cost of SiC, thin SiC based functional layer is desirable for the SiC based devices. The functional layer can be arranged on a substrate which provides the bulk material and allows for sufficient mechanical and thermal stability during processing of the SiC layer and possibly also in the final device. In addition to being less expensive than SiC, the substrate should adhere well to SiC, should be easy to handle and able to resist the processing conditions such as high temperatures, and should not contaminate the processing equipment with unwanted substances.

SUMMARY

According to an embodiment of the invention, a composite wafer comprises a substrate, comprising a porous carbon substrate core and an encapsulating layer, the encapsulating layer encapsulating the substrate core in an essentially oxygen-tight manner; and a SiC-based functional layer bonded on the substrate. The SiC-based functional layer comprises, at an interface region with the encapsulating layer, at least one of a carbide and a silicide formed by reaction of a portion of the SiC-based functional layer with a carbide-and-silicide-forming metal. The amount of the carbide-and-silicide-forming metal, integrated over the thickness of the functional layer, is $10^{-4}$ mg/cm$^2$ to 0.1 mg/cm$^2$.

According to an embodiment of the invention, a wafer comprises a SiC-based functional layer bonded on the substrate, wherein the SiC-based functional layer comprises on one side at least one of a carbide and a silicide formed by reaction of a portion of the SiC-based functional layer with a carbide-and-silicide-forming metal. The amount of the carbide-and-silicide-forming metal, integrated over the thickness of the functional layer, is $10^{-4}$ mg/cm$^2$ to 0.1 mg/cm$^2$.

According to an embodiment of the invention, a method for manufacturing a composite wafer is provided. The method comprises: providing a porous carbon substrate core; encapsulating the substrate core using an encapsulating layer, thereby obtaining a substrate; providing a SiC-based functional layer; forming an adhesion layer comprising a carbide-and-silicide-forming metal on the SiC-based functional layer or on a portion of the encapsulating layer, the adhesion layer having a thickness between 1 nm and 10 nm or between 1 nm and 100 nm; positioning the SiC-based functional layer on the substrate in such a manner that the adhesion layer is interposed between the encapsulating layer and the functional layer; and bonding the SiC-based functional layer on the substrate in such a manner that at least a portion of the carbide-and-silicide-forming metal of the adhesion layer reacts with a portion of the SiC of the functional layer to form at least one of a carbide and a silicide. In the composite wafer, the encapsulating layer encapsulates the substrate core in an essentially oxygen-tight manner.

According to an embodiment of the invention, a composite wafer comprises: a substrate comprising a porous carbon substrate core and an encapsulating layer, the encapsulating layer comprising reactively formed SiC and encapsulating the substrate core in an essentially oxygen-tight manner; and a SiC-based functional layer bonded on the substrate. The SiC-based functional layer comprises, at an interface region to the encapsulating layer, at least one of a carbide, a silicide, and a mixture of both.

According to an embodiment of the invention, a method for manufacturing a composite wafer is provided. The method comprises: providing a porous carbon substrate core; forming a Si layer on the substrate core, and forming reactively an SiC layer from the Si layer, such that the substrate core is encapsulated in an encapsulating layer that comprises the SiC layer and encapsulates the substrate core in an essentially oxygen-tight manner, thereby obtaining a substrate; providing a SiC-based functional layer; forming an adhesion layer comprising a carbide-and-silicide-forming metal on the SiC-based functional layer or on a portion of the encapsulating layer; positioning the SiC-based functional layer on the substrate in such a manner that the adhesion layer is interposed between the encapsulating layer and the functional layer; and bonding the SiC-based functional layer on the substrate in such a manner that at least a portion of the carbide-and-silicide-forming metal of the adhesion layer reacts with a portion of the SiC of the functional layer to form at least one of a carbide and a silicide.

Those skilled in the art will recognize additional features and advantages upon reading the following detailed description, and upon viewing the accompanying drawings.

BRIEF DESCRIPTION OF THE DRAWINGS

The components in the figures are not necessarily to scale or include all details. Instead, the figures are schematic and have the purpose of illustrating the principles of the invention. Moreover, in the figures, like reference numerals designate corresponding parts. In the drawings:

FIGS. 6a to 6e illustrate a method for manufacturing a composite wafer according to a further embodiment.

DETAILED DESCRIPTION

Figure 1:
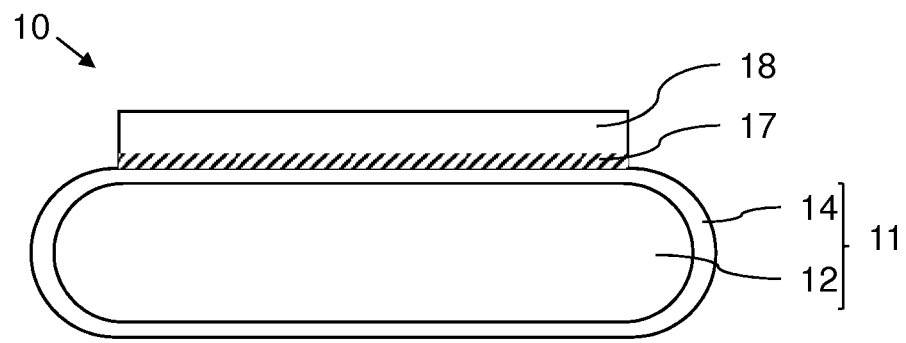
FIG. 1 is a schematic side view of a composite wafer according to an embodiment.

In the following detailed description, reference is made to the accompanying drawings, which form a part hereof, and which show, by way of illustration, specific embodiments in which the invention may be practiced. In this regard, directional terminology, such as "top", "bottom", "front", "back" etc., is used with reference to the orientation of the Figure(s) being described. Because components of embodiments can be positioned in a number of different orientations, the directional terminology is used for the purpose of illustration and is in no way limiting. It is to be understood that other embodiments may be utilised and structural or logical changes may be made without departing from the scope of the present invention. Therefore, the following detailed description is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one aspect or embodiment can be used in conjunction with features of other aspects or embodiments to yield yet a further aspect or embodiment. It is intended that the present description includes such modifications and variations.

The term "composite wafer" relates to any wafer having a (here SiC-based) functional layer and an additional element within or outside the functional layer such as an interface region. In particular, the term "composite wafer" refers to a wafer having a functional layer and a substrate on which the layer is bonded. In alternative embodiments, the substrate may have been removed, leaving behind only an interface region.

The term "vertical" as used in this specification intends to describe an orientation which is arranged perpendicular to the main surface of the semiconductor substrate.

The term "functional layer" as used in this specification intends to describe a layer that contributes directly to the functionality of a semiconductor device, such as a sensor, a diode and/or a transistor, due to its semiconducting properties, possibly after additional doping, layering, structuring, or other kinds of processing of the functional layer. When referring to semiconductor devices, normally at least two-terminal devices are meant, one example thereof being a diode. Semiconductor devices can also be three-terminal devices such as a field-effect transistors (FET), insulated gate bipolar transistors (IGBT), junction field effect transistors (JFET) and thyristors, to name a few. The semiconductor devices can also include more than three terminals. According to an embodiment, semiconductor devices are power devices.

The term "SiC-based" layer as used in this specification intends to describe a layer including Silicon carbide (SiC), i.e. a compound of silicon and carbon. This does not exclude the presence of other elements. Herein, a SiC based functional layer is understood to comprise mainly SiC (more than 50% SiC, preferably more than 80% SiC) in any crystal configuration, e.g. in a stacked configuration. In this document, any element concentration or ratio is based on particle number (number of atoms or molecules) unless stated otherwise.

The term "carbide forming metal" as used in this specification intends to describe a metallic element capable of forming a carbide when reacting with C, in particular when being brought to reaction with the SiC-based layer. The carbide forming metals can also be present in a compound, especially in a compound containing nitrogen N, such as e.g. titanium nitride. The reaction may only take place at high temperatures, e.g. above 700° C. The resulting carbide is then stable (also at lower temperatures). Likewise, the term "silicide forming metal" intends to describe a metal capable of forming a silicide when reacting with Si, in particular when being brought to reaction with the SiC-based layer. Materials included in this definition are e.g. transition metals from one of groups 4 to 10 of the periodic table. Specific metals having this property include Mo, Ta, Nb, V, Ti, W, Ni, and Cr. The silicide forming metals can also be present in a compound, especially in a compound with Si, such as silicium molybdenum. The term "amount of the carbide-and-silicide-forming metal" includes the amount of the metal present in any compound, and in particular includes the amount of the metal present in carbide and silicide of the SiC-based layer.

The term "oxygen-tight" as used in this specification intends to describe a material that is essentially oxygen-tight under processing and usage conditions of the electronic component (e.g. at temperatures up to 1500° C. or 1550° C.). "Essentially oxygen-tight", as used herein, is understood as only allowing a negligible amount of oxygen, e.g. less than 1 mg $O_2/cm^2$/h, possibly even less than 0.1 mg/$cm^2$/h.

The term "encapsulating" layer as used in this specification intends to describe a layer that coats the substrate core from all sides. The layer can include different sub-layers, e.g. one sub-layer for each side or one sub-layer arranged outside the other sub-layer. Also, "encapsulating" implies that the encapsulating layer (sub-layers) have no fully open gaps.

The term that the functional layer is "bonded" on the substrate includes any connection obtainable by bonding, in particular by thermal bonding, and does not exclude an additional layer between the two layers such as a bonding-material layer, although it is preferred that the functional layer directly contacts the substrate. Here, the term "directly contacts" means that the functional layer is directly adjacent to the substrate without any continuous other layer in between (e.g. no continuous layer of non-reacted carbide-and-silicide-forming metal). This does not exclude some local impurities or islands of non-reacted metal or other material present at their interface, for example carbide and/or silicide islands. Preferably such islands occupy less than 20% of the interface surface.

Specific embodiments described herein pertain to, without being limited thereto, composite wafers including a substrate and a SiC-based functional layer, wherein the substrate includes a porous carbon substrate core and an encapsulating layer (oxygen barrier layer) encapsulating the substrate core, wherein the SiC-based functional layer has been bonded on the substrate by reacting a thin adhesion layer of carbide-and-silicide-forming metal as a bonding layer. The carbide-and-silicide-forming metal thereby forms a carbide and/or silicide which chemically reacts with the SiC-based functional layer. The adhesion layer is so thin (thickness between 1 nm and 10 nm) that its material typically completely reacts with the SiC to form carbides and silicides which then adhere to the SiC layer. Nevertheless, due to the thinness of the adhesion layer, the metal (e.g. unreacted or bound in carbide and/or silicide) is present in such a small amount (less than $10^{-4}$ mg/$cm^2$ to 0.1 mg/$cm^2$) that a diffusion into the SiC layer is very limited, so that the metal does not diffuse significantly into the SiC bulk material but is essentially limited to an interface layer. Consequently, the low amount of metal does not interfere negatively with the function of the SiC layer. On the other hand, it has been surprisingly discovered that even if the adhesive layer is so thin that it completely reacts upon bonding, it still has a strong adhesive effect, similar to the adhesive effect of a thicker adhesive layer that would, however, lead to more diffusion of metal into the SiC layer. Other embodiments described herein pertain to wafers as described above, but from which the substrate has been fully or partially removed.

With reference to FIG. 1, a first embodiment of a composite wafer 10 is described. Substrate 11 includes a porous carbon substrate core 12 and an encapsulating layer 14. The encapsulating layer acts as an oxygen barrier and encapsulates the substrate core 12 in an essentially oxygen-tight manner.

Further, a SiC-based functional layer 18 is arranged (bonded) on the substrate 11. In the functional layer 18, an interface region 17 can be seen at an interface with the encapsulating layer 14. The interface region 17 contains carbides and/or silicides formed by reaction of a portion of the SiC-based functional layer with a carbide-and-silicide-forming metal, and optionally also comprises some remaining non-reacted carbide-and-silicide-forming metal. In this embodiment, the amount of the carbide-and-silicide-forming metal (present in the carbides and silicides and optionally also in non-reacted form) is $10^{-4}$ mg/cm$^2$ to 0.1 mg/cm$^2$, integrated over the thickness of the functional layer, i.e. integrated in direction perpendicular to a plane of the interface between the encapsulating layer 14 and the functional layer 18.

By using a substrate 11 with a porous carbon core 12, the mass of the substrate 11 can be kept small due to the small mass density of the porous carbon. This is a significant advantage over other substrates that have similarly good adherence such as substrates from pure Mo. The density of Mo is relatively high (10.2 g/cm$^3$), and a Mo substrate is therefore difficult to handle and transport due to its weight. Commercially available semiconductor processing equipment, which has been optimized for the mass of Si wafers, in many cases may not handle and transport a Mo substrate reliably. The same applies to substrates made from other metals. In contrast, the composite wafer 10 shown in FIG. 1 can be handled using standard process equipment.

However, a carbon carrier is very sensitive to oxygen, especially at high temperatures, e.g., during a furnace process. If the carbon reacts with oxygen (burns), the resulting $CO_2$ may expand and lead to the breaking off of protective layers. This problem is solved by the encapsulating layer 14 that protects the carbon substrate core 12 from oxygen. Another advantage of the porous carbon core 12 is that it adheres well to a large variety of materials, so that the encapsulating layer 14 generally adheres well to the carbon core 12.

Figure 2:
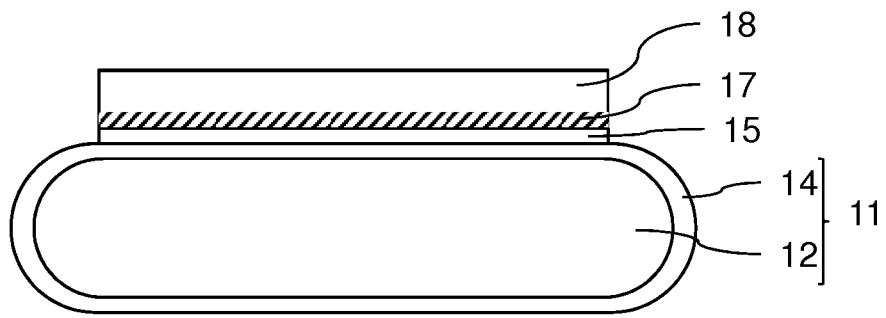
FIGS. 2 and 3 are schematic side views of composite wafers according to further embodiments.

The composite wafer of FIG. 2 is analogous to that of FIG. 1 except where noted otherwise. Namely, the composite wafer of FIG. 2 differs from that of FIG. 1 in that an additional adhesion layer 15 is interposed between the encapsulating layer 14 and the functional layer 18. Thereby, the adhesion may be further improved. The adhesion layer is preferably made of a high-temperature-resistant material with low diffusion into the functional layer. For example, the adhesion layer 15 may be made of SiC having a different crystal structure from the functional layer and/or from the encapsulating layer 14.

Figure 3:
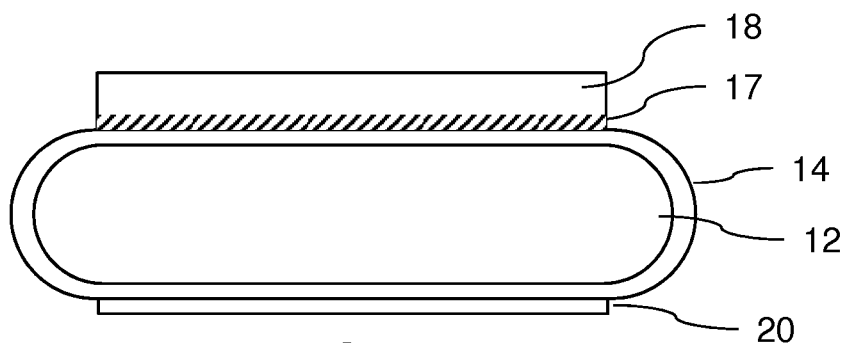

The composite wafer of FIG. 3 is analogous to that of FIG. 1 except where noted otherwise. Namely, the wafer of FIG. 3 further comprises a soldering portion 20 on the bottom side of the substrate 11, i.e. the side opposite to the functional layer 18. The soldering portion forms an electrical contact with the SiC functional layer 18 via the core 12 or via the encapsulating layer 14. To this purpose, at least a portion of the encapsulating layer 14 connecting the top side of the substrate 11 (the side facing the functional layer 18) and the bottom side of the substrate 11 (the side opposite to the functional layer 18) is electrically conductive. Herein, electrically conductive is defined as having a resistivity of less than $10^{-3}$ Ω·m.

In the following, some general aspects of the invention are discussed with reference to FIGS. 1 to 3. Herein, these Figures serves as illustration, but it is understood that each of the general aspects can also be realized in other embodiments than that of FIGS. 1 to 3, optionally in combination with any other general aspect.

Firstly, some general aspects of the SiC-based functional layer 18 are discussed. The SiC-based functional layer 18 mainly includes a compound of silicon and carbon. This does not exclude the presence of other elements, e.g. in the case of a doped layer or of other layers or of diffused metal, but according to an aspect, the combined content of Si and C in the layer is 80% or more. According to an aspect, the SiC layer may even be an essentially pure SiC layer, i.e. with a combined Si and C content of 99% or more. Preferably the functional layer consists of pure SiC, carbide, silicide, non-reacted carbide-and-silicide-forming metal, and at most 1% dopants and/or impurities. The ratio of Si to C is preferably, but not necessarily, about 1:1, e.g. between 0.9 and 1.1. Generally the SiC compound has a layered crystal structure but it may have any other crystal structure of SiC.

According to a further aspect, the functional layer has a thickness of at least 1 μm or between 5 μm and 20 μm.

According to a further aspect, the functional layer may be a portion of a power semiconductor device on the basis of SiC, such as a diode, J-FET, IGBT, MOSFET or the like. According to a further aspect, the functional layer may be a portion of a high-temperature semiconductor device such as a high-temperature sensor.

According to a further aspect, the SiC based functional layer has been split from a SiC wafer by proton-induced splitting, which is visible from the splitting surface on the side of the functional layer opposite to the substrate 11, 21, and/or from traces of the protons implanted in the substrate.

Next, some general aspects of the carbide-and-silicide-forming metal and of the interface region 17 are discussed. According to an aspect, the interface region 17 contacts directly the encapsulating layer without any further continuous layer in between. In particular, there is no continuous layer of non-reacted carbide-and-silicide-forming metal. However, this does not exclude some local impurities of non-reacted metal as long as they do not form a continuous layer.

According to an aspect, the amount of the carbide-and-silicide-forming metal, integrated over the thickness of the functional layer 18, is $10^{-4}$ mg/cm$^2$ to 0.1 mg/cm$^2$. According to a further aspect, the amount of the carbide-and-silicide-forming metal is mainly concentrated at the side of the substrate 11 (at the interface region 17), with more than 50%, preferably more than 80% of the carbide-and-silicide-forming metal being present in the interface region. According to an aspect, the interface region has a thickness of 300 nm or less. (Before the process, the thickness is preferably even less than 100 nm).

The forming of carbides and silicides from suitable metal in the interface region 17 has the advantage of ensuring good adherence of the functional layer 18 to the substrate 11. In particular, the interface region 17 may be formed by a reaction of metals of a thin metal layer with Si and C from the functional layer 18 to form carbides and/or silicides, possibly after a high-temperature treatment. This reaction ensures a particularly good adherence, regardless of whether the SiC layer is contacted at its C face (so that mainly carbides are formed) or if the SiC layer is contacted at its Si face or at a mixed face, e.g. in the case of an amorphous or polycrystalline SiC layer 18. Thereby, according to an aspect, the adherence between the substrate 11 and the functional layer 18 is higher than 5 to 10 MPa. Additionally or alternatively, the adherence may be even stronger than an adherence within the carbon layer 12, so that when the bonded functional layer is pulled off with strong force, the carbon layer is fractured rather than the interface between the substrate 11 and the functional layer 18.

According to a further aspect, the carbide and silicide forming metal is a transition metal from one of groups 4 to 10 of the periodic table having this property. For example, the carbide and silicide forming metal may include, or be, at least one element selected from the group consisting of: Mo, Ta, Nb, V, Ti, W, Ni, and Cr. Ti, Mo and W are especially advantageous due to their high temperature strength. Further suitable materials are metal-silicon bilayers or other metal compounds capable of forming carbide and silicide.

According to a further aspect, during the bonding of the SiC-based functional layer 18 on the substrate 10, the interface region 17 ensures not only that the adhesion is strong, but also that the crystal structure is not transferred, so that no defects are induced in the functional layer. Hence, it is advantageous that the interface region 17 has a crystal structure that is different from that of the functional layer 18.

According to a further aspect, the interface region 17 includes a plurality of different intermediate layers. In particular, the intermediate layers contain reaction products of the carbide and silicide forming metal with the SiC based functional layer, e.g. at least one carbide phase and/or at least one silicide phase. For example, in the case of the carbide-and-silicide-forming metal being Mo, the phases may include one or more of MoCSi, MoSi, and MoC phases. Generally, these phases can be obtained by only moderately heating the components (to less than 700° C., e.g. in the range 500-700° C.), and the resulting carbide phase and/or silicide phase are nevertheless generally highly temperature resistant and well-suited to the further processing steps and working conditions even at high temperature.

According to an aspect, the interface region 17 is electrically conductive, and in particular has a resistivity of less than $10^{-3}$ Ω·m.

Next, some general aspects of the encapsulating layer 14 are discussed. According to an aspect, the encapsulating layer 14 comprises (may be made of or have a sub-layer made of) at least one of SiC, a Si oxide, a Si, a Ti oxide, and nitrides like $Si_3N_4$ or a metal nitride like e.g. TiN or TaN. According to a preferred aspect, the encapsulating layer (or a sub-layer thereof) is made of Si that has been reactively obtained from a Si layer.

According to a further aspect, the encapsulating layer 14 may be a multi-layered structure including a plurality of sub-layers. For example, a first sub-layer of the encapsulating layer may be a layer of SiC as described herein, and a second sub-layer may be a $Si_3N_4$ layer. The sub-layers may be arranged next to each other so that they encapsulate the substrate core 12 jointly, and/or they may be arranged on top of each other, e.g. the second sub-layer being arranged at an outer side of the first sub-layer. In this case, one of the sub-layers may be an oxygen barrier sub-layer (e.g. SiC) and the other sub-layer(s) may have another function, e.g. improving adherence or chemical inertness.

According to an aspect, the encapsulating layer 14 is temperature resistant up to temperatures of at least 1500° C. According to an aspect, the encapsulating layer 14 is essentially oxygen-tight for temperatures of up to at least 1500° C. According to a further aspect, the encapsulating layer has a thickness of at least 300 nm. According to an aspect, the encapsulating layer 14 has a temperature expansion coefficient differing from that of the functional layer 18 by less than 15%.

Next, some general aspects of the substrate 11, 21 are discussed. According to an aspect, the carbon substrate core 12 has a mass density of at most 5 g/cm$^3$, more preferably of at most 3 g/cm$^3$. According to a further aspect, the substrate (substrate core including the adhering layer) has a mass density (i.e. total mass divided by total volume) of at most 5 g/cm$^3$. According to another aspect, the porosity of the graphite core is 5% or more, 8% or more, or even 10% or more. Hence, due to the porosity, the density of the carbon substrate core 12 may even be less than the normal density of graphite (about 2 to 3 g/cm$^3$).

According to an aspect, the substrate core 12 has an average pore diameter of at most 30 μm. Typical Pore size is between 5 and 25 μm. There are also other materials/manufactures. According to an aspect, at least some of the pores at the surface of the carbon substrate core 12 are closed by a pore-plug material. Thereby, the surface of the substrate core 12 is smoothened and adherence to the encapsulating layer 14 is improved.

According to a further aspect, the substrate core has at least one of the following dimensions: a thickness of at least 300 μm or at least 600 μm and/or of at most 2 mm or at most 1 mm. The substrate core may have two parallel faces separated by the thickness. The faces may be of substantially circular shape. The substrate core's diameter may correspond to the diameter of commercially available silicon wafers, such as about 100 mm, 150 mm, 200 mm, 300 mm or 450 mm in order to fit to available equipment for semiconductor processing (herein, "about" is defined as "up to a deviation of 5%"). Other diameters are also possible. According to a general aspect, the diameter is between 80 mm and 600 mm. In other examples, the substrate core's shape may be circular, elliptical, polygonal or rectangular, and/or have a different diameter than mentioned above.

It is noted that the composite component or any part thereof, such as the substrate 10, may also include further layers in addition to the layers mentioned herein. For example, the functional layer may include additional layers such as a buried insulating layer and/or at least one protective layer for protecting the functional layer.

Figure 4A:
FIGS. 4a, 4b and 5a to 5c are schematic side views of composite wafers, in which the substrate has been fully or partially removed, according to further embodiments.
Figure 4B:
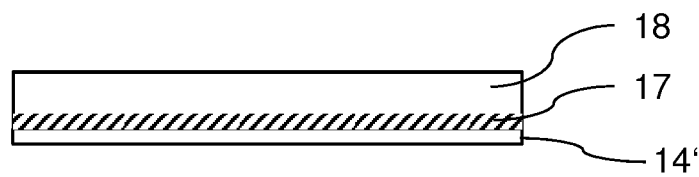

FIGS. 4a and 4b shows a wafer according to a further embodiment having only the functional layer 18 of FIG. 1. However, the substrate 11 of FIG. 1 is removed. Thus, the SiC-based functional layer 18 comprises on one side (bottom side with the interface region 17) at least one of a carbide and a silicide formed by reaction of a portion of the SiC-based functional layer with a carbide-and-silicide-forming metal, and the amount of the carbide-and-silicide-forming metal, integrated over the thickness of the functional layer, is $10^{-4}$ mg/cm$^2$ to 0.1 mg/cm$^2$. The functional layer 18 may also comprise some remaining non-reacted carbide- and silicide-forming metal, however according to a particular aspect the wafer is free of any continuous layer of non-reacted carbide-and-silicide-forming metal. In a particular aspect, removal traces from removing the substrate (e.g. abrasion traces) are detectable on the bottom side of the interface region 17.

In addition, in the embodiment of FIG. 4b, also some abraded SiC material 14', which is a portion of the former encapsulating layer 14 of FIG. 1, can be seen. In a particular aspect, removal traces from removing the remainder of the substrate (e.g. abrasion traces) are detectable on the bottom side of the material 14'. The crystal structure of the material 14' is, in a particular aspect, different from the crystal structure of the functional layer 18.

The carbide-and-silicide-forming metal may be as described in relation to FIG. 1, e.g. Mo, Ta, Nb, V, Ti, W, Ni, and/or Cr. Also the other descriptions of embodiments and aspects illustrated in FIGS. 1-3 apply insofar as they do not contradict FIGS. 4a and 4b.

Figure 5A:
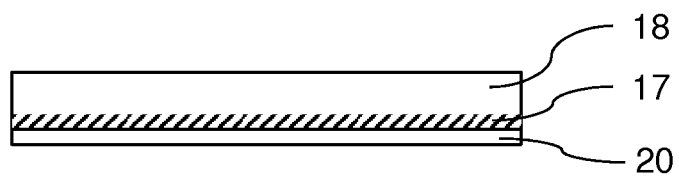
Figure 5B:

FIGS. 5a and 5b correspond to FIGS. 4a and 4b as described above, with the following difference: Additionally the wafer comprises a soldering portion 20 in electrical contact with the SiC functional layer 18. The soldering portion is arranged on the side of the wafer of the interface portion 17. The soldering portion is in electrical contact with the SiC functional layer 18 via the interface portion 17.

Figure 5C:
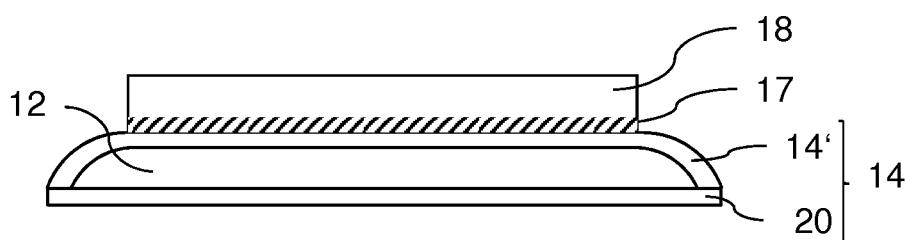

The composite wafer of FIG. 5c is analogous to that of FIG. 2 except for the following differences: A portion of the substrate 11 of FIG. 2 is removed, whereas a portion of the substrate (portion of substrate core 12 and SiC material 14' from the former encapsulating layer 14 of FIG. 2) remains.

Further, the wafer of FIG. 5c further comprises a soldering portion 20 on the bottom side of the substrate 11, i.e. the side opposite to the functional layer 18. Thereby the soldering portion 20 covers, in an essentially oxygen-tight manner, the side of the substrate core 12 that was left exposed when the portion of the substrate was removed. Hence, the material 14' (first sub-layer comprising e.g. reactively formed SiC) and the soldering portion 20 (second sub-layer) constitute an encapsulating layer 14 that encapsulates the substrate core 12. Further, the soldering portion is in electrical contact with the SiC functional layer 18 via the core 12 or via the material 14' of the encapsulating layer 14 analogous to the embodiment of FIG. 3 described above.

In an alternative embodiment, the soldering portion 20 of FIG. 5c is replaced by a two-layer structure with a first sub-layer being an essentially oxygen-tight layer (e.g. of SiC) and a second sub-layer, arranged below (outside) the first sub-layer, being the soldering portion. The resulting wafer is similar to that of FIG. 3, but with removal traces on the lower side of the substrate core 12 and with the encapsulating layer 14 being composed of two sub-layers (layer 14' of FIG. 5c and first sub-layer as described above).

Figure 6C:
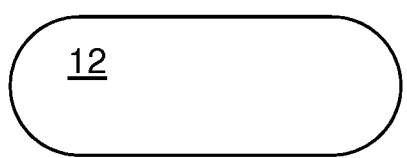
Figure 6C:
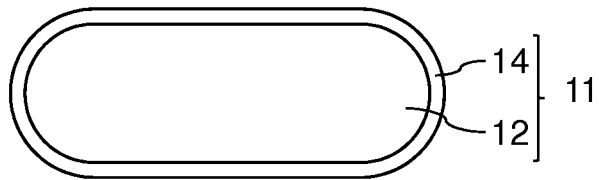
Figure 6C:
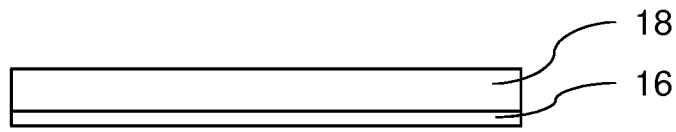

Next, with reference to FIGS. 6a to 6c, a method for manufacturing a composite wafer according to a further embodiment is described. As shown in FIG. 6a, a porous carbon substrate core 12 is provided. Then, as shown in FIG. 6b, the substrate core 12 is encapsulated using an encapsulating layer 14.

The encapsulating layer can be applied using any method such as sputtering, galvanization, CVD deposition, any other method of applying a layer, or a combination thereof. Possibly, more than one layering step is performed in order to encapsulate the substrate core 12 from all sides. Optionally, additional process steps such as chemically reacting the layer are performed for increasing the oxide-tightness of the encapsulating layer 14. For example, the encapsulating layer 14 may be formed as an amorphous or polycrystalline Si layer, and at a later step (possibly after bonding described below) may be reacted to form a SiC layer. In an alternative embodiment, the Si layer may be subjected to a reaction with $O_2$, whereby an essentially oxygen-tight $SiO_2$ layer is formed. Optionally, the Si layer and/or the encapsulating layer 14 may be planarized, especially at a face on which the functional layer is to be bonded. As a result of any of these techniques, an essentially oxygen-tight encapsulating layer 14 is obtained (possibly after additional process steps such as bonding).

According to a particularly preferred general embodiment of the invention, the encapsulating layer is made of reactively formed SiC, which was reacted from a Si layer having at least a portion which was planarized prior to the reactive forming of the SiC. Such an encapsulating layer can be distinguished from a directly formed SiC layer because a planarization of Si (which is relatively soft) leaves different traces than a planarization of SiC. By planarizing the initial Si layer before the reaction to SiC takes place, the more difficult planarization of SiC before bonding may be avoided or at least reduced.

As a further method step as shown in FIG. 6c, a SiC-based functional layer 18 is provided. This can be done before, after, or in parallel to the process steps shown in FIGS. 6a and 6b. Then, an adhesion layer 16 is formed on the functional layer 18 using any layering method such as sputtering, galvanization, CVD deposition, or the like, such that the adhesion layer 16 (directly) contacts the SiC-based functional layer 18. The adhesion layer 16 includes a carbide and silicide forming metal and has a thickness between 1 nm and 10 nm.

Figure 6D:
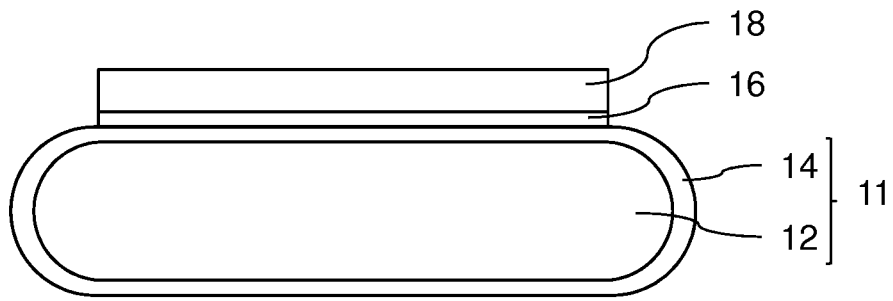

Then, as shown in FIG. 6d, the SiC-based functional layer 18, on which the adhesion layer 16 has been formed, is arranged on the substrate 11 in such a manner that the adhesion layer 16 is interposed between the encapsulating layer 14 and the functional layer 18.

In an alternative embodiment, the adhesion layer may be formed on a top portion of the encapsulating layer 14, instead of being formed on the SiC-based functional layer as shown in FIG. 6c. In this alternative embodiment, the SiC-based functional layer 18 is then arranged on the substrate 11 in such a manner that the adhesion layer 16 is interposed between the encapsulating layer 14 and the functional layer 18, i.e. the configuration of FIG. 5d is obtained. The remaining steps, explained below, are the same for both embodiments.

In an alternative embodiment, a part of the adhesion layer may be formed on a top portion of the encapsulating layer 14, and a part of the adhesion layer may be formed on the SiC-based functional layer as shown in FIG. 6c. The both parts of the adhesion layer 16 may be of the same or of different material. In this alternative embodiment, the SiC-based functional layer 18 is then arranged on the substrate 11 in such a manner that the two parts of the adhesion layer 16 are interposed between the encapsulating layer 14 and the functional layer 18, i.e. the configuration of FIG. 5d is obtained. The remaining steps, explained below, are the same for all three embodiments and variations thereof.

Figure 6E:
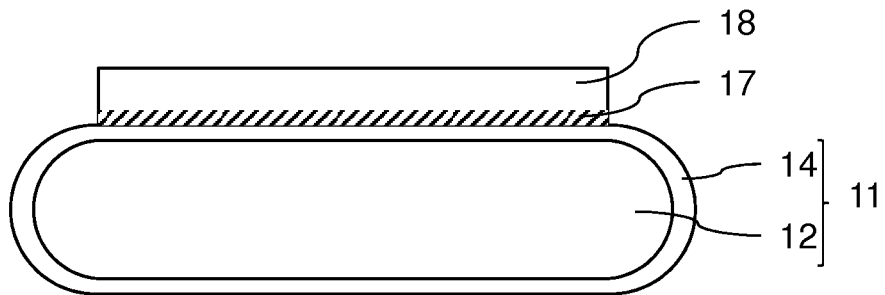

As shown in FIG. 6e, a bonding reaction is then carried out. The bonding reaction may be a thermal treatment, wherein the components shown in FIG. 6d are heated to a temperature allowing the carbide and silicide forming metal of the adhesion layer 16 or the two parts of the adhesion layer 16 to react with the SiC based functional layer 18 at their interface. For example, the temperature may be in a range of 500° C. to 700° C. As a result of the bonding reaction (thermal treatment), at least one carbide phase and/or at least one silicide phase is formed.

The adhesion layer 16 is so thin that during the bonding reaction, essentially all of the carbide-and-silicide-forming metal of the adhesion layer 16 reacts with some of the SiC of the functional layer 18 to form a carbide and/or a silicide, so that essentially no unreacted metal of the layer 16 remains (except possibly some local islands of unreacted material or impurities). In other words, no continuous layer of unreacted carbide-and-silicide-forming metal remains between the functional layer 18 and the encapsulating layer 14. As a result, the adhesion layer 16 as a continuous layer disappears, and instead, a carbide phase and/or at least one silicide phase is created and partially that forms an interface region 17 of the functional layer 18.

According to a particular embodiment, if the encapsulating layer 14 was applied as a Si layer, the Si layer may be brought to reaction thus forming an oxygen-tight layer during the thermal treatment. For example, the Si layer may be brought to a reaction forming SiC as explained above.

In the following, some general aspects of the invention are discussed with reference to FIGS. 6a-6e. Herein, these Figures only serve as illustration, and the general aspects can also be realized in other embodiments.

According to an aspect, prior to the encapsulating step, an additional step of applying an adhering/pore-plugging material on the substrate core 12 may be included. Additionally or alternatively, the substrate core 12 may be planarized.

According to an aspect, the encapsulating step can be performed using any one of the following:

(i) The porous carbon substrate core 12 is encapsulated by sputtering, galvanizing and/or depositing the encapsulating material thereon;

(ii) The porous carbon substrate core 12 is encapsulated by sputtering, galvanizing and/or depositing a precursor material, and then by reacting the precursor material to obtain the encapsulating layer.

In method (i), the encapsulating layer 14 may be applied as an essentially oxygen-tight layer; in method (ii), the encapsulating layer (the precursor material) may later be subjected to a reaction to become essentially oxygen-tight. Method (i) may be used for applying Mo, Ta, Nb, V, Ti, W, Ni, Cr or another suitable carbide and silicide forming metal. Method (ii) may be used for applying a Si oxide or SiC layer. Here, first a Si layer (e.g. an amorphous or polycrystalline Si layer) may be applied to the substrate core 12 (to which optionally an additional adhering/pore-plugging material has been applied), and then a Si oxide or SiC layer is formed reactively from the Si layer. For example, a SiC layer can be formed using a heating process at 1000° C. to 2000° C., preferably at 1300° C. to 1500° C., in an environment in which the Si layer reacts to SiC. The heating time may vary between 2 minutes and 2 hours, depending on the desired thickness. The SiC layer is particularly suitable for the embodiment described herein. Optionally, the precursor material may be planarized at least at the surface which is to contact the adherence layer 16.

According to an aspect, the SiC-based functional layer 18 can be provided using proton-induced cutting, also referred to as "smart cut". According to this proton-induced cutting step, the SiC based functional layer is first provided as part of a SiC based wafer in which protons have been implanted at high intensity. Then, the SiC wafer is bonded to the substrate 11 as described herein. Then, a high-temperature process is performed at which the functional layer (to which the substrate 11 has been bonded) is split off from the SiC based wafer. Optionally, the top surface of the functional layer 18 (i.e. the surface opposite to the substrate 11) is abraded or otherwise treated. This technique can be noticed from the component by the implanted protons in the functional layer (and in some cases by the shape of the top surface).

According to an aspect, the method further includes processing the SiC functional layer 18, e.g. by one or more processing steps such as epitaxy; doping; etching; isolation of devices from each other; contacting; and/or packaging. For example, the functional layer may be processed so that a semiconductor device on the basis of SiC is obtained, such as a diode, J-FET, IGBT, MOSFET, SiC-SOI device or any other device mentioned herein.

Also, any of the aspects mentioned with respect to FIGS. 1 to 3 may be used for the method described herein.

As an additional optional process step of the method of FIGS. 6a to 6e, a soldering portion may be formed on a side of the substrate 11 opposite to the functional layer 18. This step then results in the configuration shown in FIG. 2. The soldering portion 20 may, for example, be formed by galvanization or electroplating. The soldering portion 20 may, for example, include copper or a lead-free solder.

According to an aspect, at least part of the encapsulating layer 14 is electrically conductive, so that at least one conductive path is formed between the SiC functional layer 18 and the soldering portion 20 via the encapsulating layer 14. Also, the soldering portion 20 may comprise a stack of different materials or layers. Also, the soldering portion 20 may have a plurality of soldering contacts, and respective conductive paths (electrically isolated from each other) may be formed between each soldering contact and a respective portion of the SiC functional layer 18 via the encapsulating layer 14.

As an additional optional process step of the method of FIGS. 6a to 6e, an additional adhesion layer 15 may be applied to the substrate 11 or the functional layer 18, such that in the configuration of FIG. 6d, the additional adhesion layer 15 is interposed between the substrate 11 and the adhesion layer 16. The additional layer 15 may, for example, be made from SiC having a different crystal structure than the material of the encapsulating layer 14 or being amorphous. As a result, the composite wafer of FIG. 3 is obtained.

As an additional optional process step of the method of FIGS. 6a to 6e, the substrate 11 may be removed again partially or completely, e.g. by abrasion, after the step of FIG. 6d or 6e, and optionally after further processing steps for processing of the functional layer 18. As a result, the structure shown in FIG. 4a or 4b is obtained.

Alternatively, the substrate may be removed only partially. If the substrate is removed only partially, a further layer may be applied to the remaining substrate portion such that the remaining substrate portion is, again, encapsulated in an oxygen-tight manner, e.g. as shown in FIG. 5c.

As an additional optional process step, the soldering portion 20 may be formed on the side of the composite wafer from which the substrate 11, or portion of the substrate 11, has been removed. The soldering portion 20 may be formed by galvanization. The soldering portion 20 may be formed to be in electrical contact with the SiC functional layer 18. With this optional step, the structure shown in FIG. 5a or 5b can be obtained.

It is to be understood that the features of the various exemplary embodiments described herein may be combined with each other, unless specifically noted otherwise.

As used herein, the terms "having", "containing", "including", "comprising" and the like are open ended terms that indicate the presence of stated elements or features but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a composite wafer, the method comprising:
   providing a porous carbon substrate core;
   encapsulating the substrate core using an encapsulating layer, thereby obtaining a substrate;
   providing a SiC-based functional layer;
   forming an adhesion layer, comprising a carbide-and-silicide-forming metal on the SiC-based functional layer or on a portion of the encapsulating layer, the adhesion layer having a thickness between 1 nm and 10 nm;
   positioning the SiC-based functional layer on the substrate in such a manner that the adhesion layer is interposed between the encapsulating layer and the functional layer; and
   bonding the SiC-based functional layer on the substrate in such a manner that at least a portion of the carbide-and-silicide-forming metal of the adhesion layer reacts with a portion of the SiC of the functional layer to form at least one of a carbide and a silicide, wherein the encapsulating layer encapsulates the substrate core in an essentially oxygen-tight manner.

2. The method according to claim 1, wherein the encapsulating comprises forming the encapsulating layer by means of any one of sputtering, galvanization, and CVD deposition.

3. The method according to claim 1, wherein the encapsulating comprises forming an amorphous or polycrystalline Si layer.

4. The method according to claim 3, wherein the encapsulating further comprises reactive forming of an $SiO_2$ layer or an SiC layer from the Si layer.

5. The method according to claim 1, further comprising forming a soldering portion on a side of the substrate opposite to the functional layer, such that the soldering portion is in electrical contact with the SiC functional layer via the encapsulating layer.

6. The method according to claim 1, further comprising at least partially removing the substrate.

7. The method according to claim 6, further comprising forming a soldering portion on a side of the wafer opposite to the functional layer, such that the soldering portion is in electrical contact with the SiC functional layer.

8. The method according to claim 1, further comprising processing the SiC functional layer.

9. The method according to claim 8, wherein processing the SiC functional layer comprises forming any one of the following in the SiC functional layer: a sensor, a diode, and a transistor.

10. A method for manufacturing a composite wafer, the method comprising:
providing a porous carbon substrate core;
forming a Si layer on the substrate core, and forming reactively an SiC layer from the Si layer, such that the substrate core is encapsulated in an encapsulating layer that comprises the SiC layer and encapsulates the substrate core in an essentially oxygen-tight manner, thereby obtaining a substrate;
providing a SiC-based functional layer;
forming an adhesion layer comprising a carbide-and-silicide-forming metal on the SiC-based functional layer or on a portion of the encapsulating layer;
positioning the SiC-based functional layer on the substrate in such a manner that the adhesion layer is interposed between the encapsulating layer and the functional layer; and
bonding the SiC-based functional layer on the substrate in such a manner that at least a portion of the carbide-and-silicide-forming metal of the adhesion layer reacts with a portion of the SiC of the functional layer to form at least one of a carbide and a silicide.

* * * * *